United States Patent [19]

Motai et al.

[11] Patent Number: 4,892,613

[45] Date of Patent: Jan. 9, 1990

[54] PROCESS FOR ETCHING LIGHT-SHIELDING THIN FILM

[75] Inventors: Noboru Motai, Tochigi; Sakae Tanaka; Yoshiaki Watanabe, both of Tokyo; Katsuo Shirai; Yaeko Suzuki, both of Tochigi; Yoshihisa Ogiwara, Tochigi; Kazunori Saito, Tochigi; Keiko Shibuki, Tochigi, all of Japan

[73] Assignees: Nippon Precision Circuits Ltd.; Seikosha Co., Ltd., both of Tokyo, Japan

[21] Appl. No.: 290,076

[22] Filed: Dec. 27, 1988

[30] Foreign Application Priority Data

Dec. 29, 1987 [JP] Japan .................................. 62-336682
Dec. 2, 1988 [JP] Japan .................................. 63-305763

[51] Int. Cl.$^4$ ...................... C23F 1/02; H01L 21/306; B44C 1/22; C03C 15/00
[52] U.S. Cl. .................................. 156/643; 156/651; 156/656; 156/657; 156/659.1; 156/662; 156/904; 204/192.37

[58] Field of Search ............... 156/643, 646, 651, 656, 156/657, 659.2, 661.1, 662, 664, 904; 437/40, 41, 228, 233, 234, 245; 204/192.35, 192.37; 427/38, 39; 252/79.1

[56] References Cited

U.S. PATENT DOCUMENTS 4,514,252 4/1985 Roland ................................. 156/643
4,544,445 10/1985 Jeuch et al. ....................... 156/651 X
4,715,930 12/1987 Diem .................................. 437/101

*Primary Examiner*—William A. Powell
*Attorney, Agent, or Firm*—Jordan and Hamburg

[57] ABSTRACT

A light shielding thin film is provided on a light transmitting substrate, and the film is covered by a photoresist. The photoresist is exposed and developed to form a pattern, and the film is etched using the pattern as a mask. The pattern is then exposed through the substrate, using the film as a mask, the pattern then being developed to form a pattern of reduced size. The film is then etched using the reduced size pattern as a mask.

4 Claims, 5 Drawing Sheets

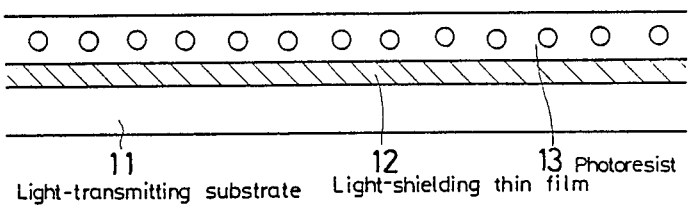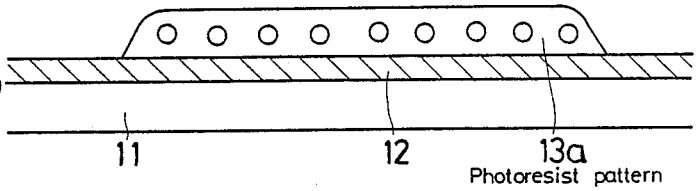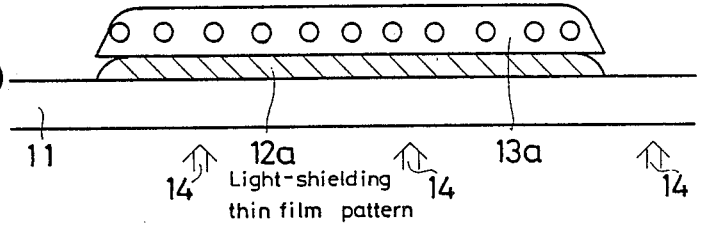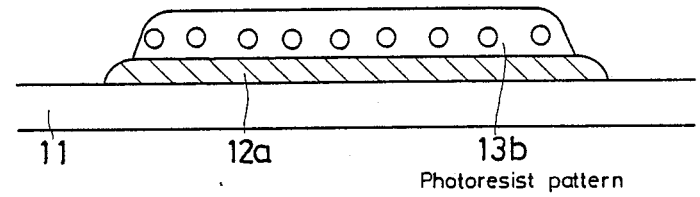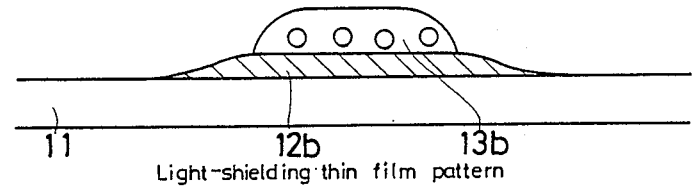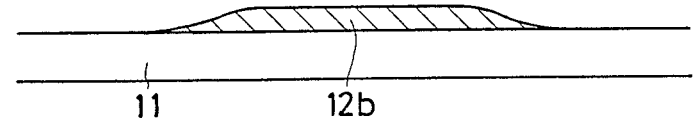

PROCESS FOR ETCHING LIGHT-SHIELDING THIN FILM

DETAILED DESCRIPTION OF THE INVENTION

1. Field of Industrial Application

The present invention relates to a process for etching a light-shielding thin film.

2. Prior Art

Heretofore, the etching of a light-shielding thin film has been accomplished by the steps of applying a photoresist onto a light-shielding thin film, exposing the photoresist for a desired pattern, developing the exposed photoresist to form a desired photoresist pattern, and etching the light-shielding thin film by using the photoresist pattern as a mask.

Problems to be solved by the invention

The above-mentioned conventional etching has a disadvantage that after etching, the light-shielding thin film has a sharp step. Therefore, when forming a thin film to cover the step of the edge of the light-shielding thin film, the step is not completely covered, and snapping results.

The present invention was completed to solve the abovementioned problem. Accordingly, it is an object of the present invention to provide a process for etching a light-shielding thin film which permits the step to be covered completely.

BRIEF DESCRIPTION OF THE DRAWINGS

FIGS. 1(A)-1(F), 2(A)-2(H) and 3(A)-3(H) illustrate manufacturing steps in first, second and third embodiments, respectively in accordance with the invention.

DESCRIPTION OF THE PREFERRED EMBODIMENTS

Figure 2A:
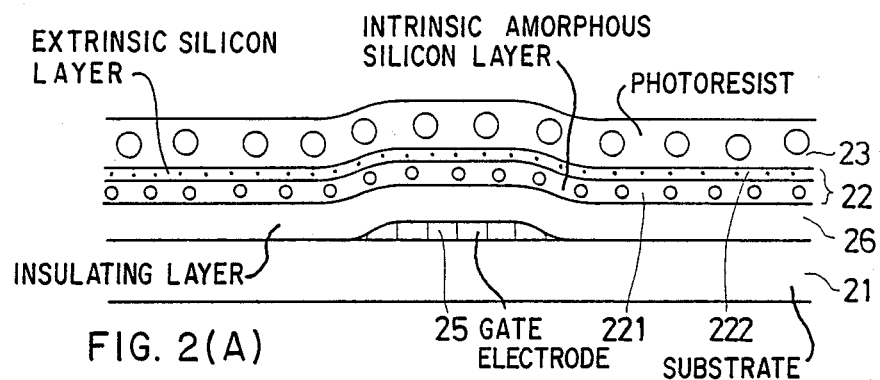

Embodiments of the present invention will be described with reference to the accompanying drawings.

FIG. 1 shows a first embodiment of the present invention, in which the process for etching a light-shielding thin film is applied to a metal thin film forming gate electrodes or gate wiring of thin-film transistor.

FIG. 1 shows an insulating light-transmitting substrate such as glass (11), a light-shielding thin film of metal thin film (12), and a photoresist (13).

Each step of the process will be described in the order of FIGS. 1(A) to 1(F).

In FIG. 1(A) on the light-transmitting substrate 11 is evaporated a light-shielding thin film 12 (Cr in this case) to form a gate electrode. To this light-shielding thin film 12 is applied a positive photoresist 13, which is subsequently prebaked.

In FIG. 1(B) the prebaked photoresist 13 is exposed, followed by development, to form a photoresist pattern 13a of desired shape. Incidentally, no post-baking is performed.

In FIG. 1(C) using the photoresist pattern 13a as a mask, the light-shielding thin film 12 is etched by an aqueous solution of ceric ammonium nitrate ($(NH_4)_2Ce(NO_3)_6$) to form the light-shielding thin film pattern 12a. Then, the light-transmitting substrate 11 is irradiated through the reverse side with ultraviolet rays 14. (This step is referred to as back exposure.) Since the ultraviolet rays 14 are absorbed by the light-shielding thin film pattern 12a, the photoresist pattern 13a is hardly exposed. However, the edge of the photoresist pattern 13a is partly exposed by the diffracted or reflected (by backplate) ultraviolet rays 14.

In FIG. 1(D) the photoresist pattern 13a is developed so that the edge of the photoresist pattern 13a which has been exposed in the step of FIG. 1(C) is removed. Thus the photoresist pattern 13b is smaller than the photoresist pattern 13a.

In FIG. 1(E) the light-shielding thin film pattern 12a is etched by plasma dry etching which uses a mixed gas of tetrachloroethane ($CCl_4$) and oxygen as an etchant. During the plasma dry etching, the photoresist pattern 13b is retreated. (Incidentally, a mixed gas of chlorine-containing gas and oxygen is used in this example because a metal thin film of chromium is used as the light-shielding thin film. This mixed gas may be replaced by another gas composed of fluorine-containing gas and oxygen in the case where other metal thin film is used.)

In FIG. 1(F) the photoresist pattern 13b is removed. Thus a gate electrode of light-shielding thin film pattern 12b is formed.

The light-shielding thin film pattern 12b formed by the above-mentioned steps has a thinned edge, as shown in FIG. 1(F), because the light-shielding thin film has undergone etching twice.

Especially in the case where the second etching is performed by plasma dry etching, the resulting light-shielding thin film pattern 12b has a very smoothly tapered edge.

FIG. 2 shows a second example of the present invention, in which the etching of the light-shielding thin film is applied to a semiconductor thin film of thin film transistor.

FIG. 2 shows a insulating light-transmitting substrate such as glass (21), a light-shielding thin film of semiconductor thin film (22), and a photoresist (23).

Each step of the process will be described in the order of FIGS. 2(A) to 2(H).

In FIG. 2(A) the substrate 21 has a previously formed gate electrode 25 (preferably formed by the process shown in the above-mentioned first example) and a gate insulating layer 26. On this substrate 21 are formed an intrinsic amorphous silicon layer 221 (150-250 nm thick) and an extrinsic silicon layer 222 (30-50 nm thick) by plasma CVD method. (The former silicon layer contains substantially no impurities which function as donors or acceptors, and the latter silicon layer contains a proper amount of impurities which function as donors or acceptors.) The intrinsic amorphous silicon layer 221 and the extrinsic silicon layer 222 are semiconductor thin films which constitute the light-shielding thin film 22. Onto this light-shielding thin film 22 is applied a positive photoresist 23, followed by prebaking.

Figure 2B:
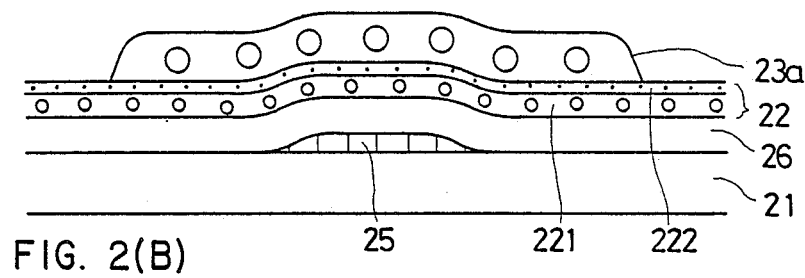

In FIG. 2(B) the prebaked photoresist 23 is exposed, followed by development, to form a photoresist pattern 23a of desired shape. Incidentally, no post-baking is performed.

Figure 2C:
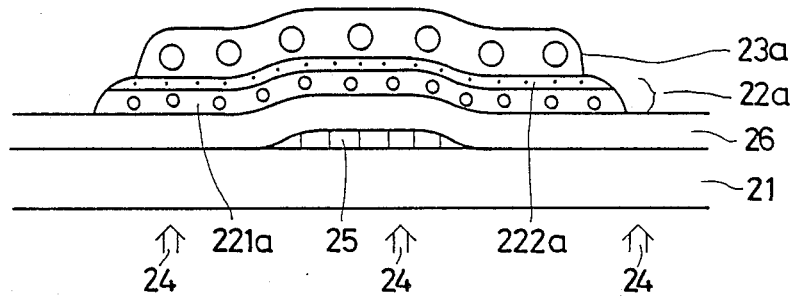

In FIG. 2(C) using the photoresist pattern 23a as a mask, the light-shielding thin film 22 is etched in the usual way to form the light-shielding thin film pattern 22a. (In the case where the light-shielding thin film is made of silicon as in this example, the light-shielding thin film 22 is etched, while the photoresist pattern 23a is retreated by the resist retreating method, with plasma dry etching in which a mixed gas of fluorine-containing gas (e.g., $CF_4$) and oxygen is used as an etchant.) Then, the light-transmitting substrate 21 is irradiated through the reverse side with ultraviolet rays 24 (back exposure). Since the ultraviolet rays 24 are absorbed by the light-shielding thin film pattern 22a, the photoresist pattern 23a is hardly exposed. (A thickness of about 200 nm is enough for the ultraviolet rays to be mostly absorbed by the light-shielding thin film of amorphous silicon.) However, the edge of the photoresist pattern 23a is partly exposed by the diffracted or reflected (by backplate) ultraviolet rays 24.

Figure 2D:
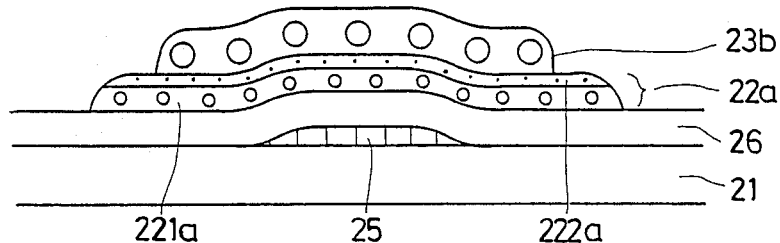

In FIG. 2(D) the photoresist pattern 23a is developed so that the edge of the photoresist pattern 23a which has been exposed in the step shown in FIG. 2(C) is removed. Thus the photoresist pattern 23b is smaller than the photoresist pattern 23a.

Figure 2E:
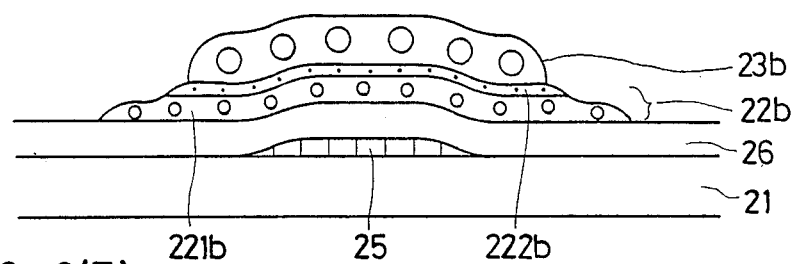

In FIG. 2(E) the light-shielding thin film pattern 22a is etched by plasma dry etching which uses a mixed gas of fluorine-containing gas such as CF₄ and oxygen as an etchant. During the plasma dry etching, the photoresist pattern 23b is retreated. (Incidentally, a mixed gas of fluorine-containing gas and oxygen is used in this example because a semiconductor thin film of silicon is used as the light-shielding thin film. This mixed gas may be replaced by another gas according to the type of semiconductor thin film used.)

Figure 2F:
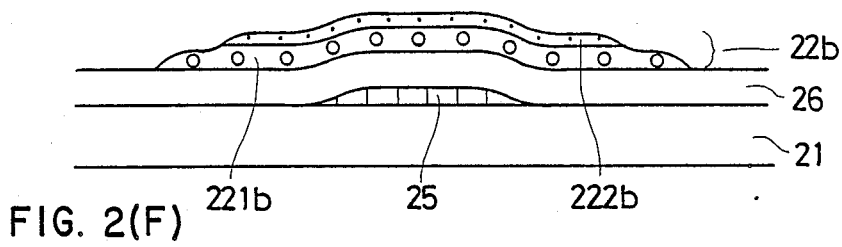

In FIG. 2(F) the photoresist pattern 23b is removed. Thus a light-shielding thin-film pattern 22b of island structure is formed.

The light-shielding thin film pattern 22b formed by the above-mentioned steps has a thinned edge, as shown in FIG. 2(F), because the light-shielding thin film has undergone etching twice.

Figure 2G:
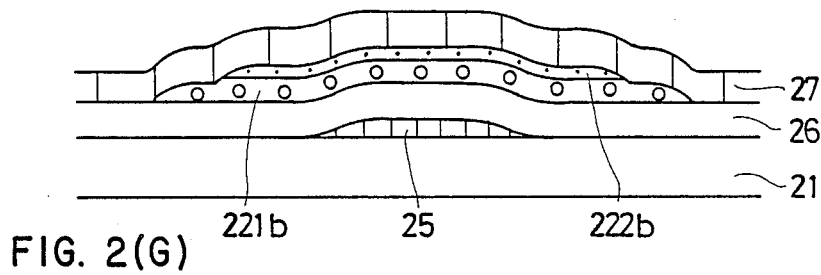

In FIG. 2(G) a conductive thin film 27 of ITO (indium tin oxide) for the source and drain electrodes is formed by EB evaporation or sputter evaporation. Since the light-shielding thin film pattern 22b has a thinned edge, good step coverage of the conductive thin film 27 is obtained without possibility of breaking of the conductive thin film 27 at the steps.

Figure 2H:
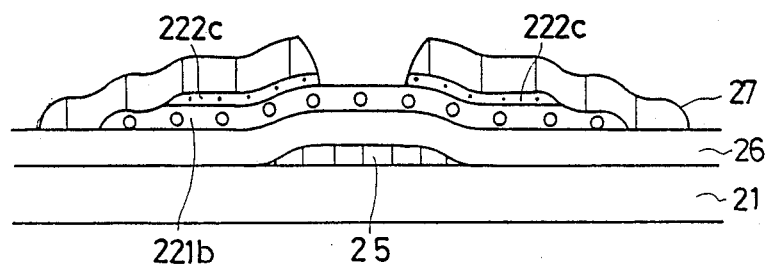

In FIG. 2(H) the conductive thin film 27 is patterned according to a desired shape. Using the patterned conductive thin film 27 as a mask, the extrinsic silicon layer 222b is etched to form the source and drain electrodes 222c.

Thus a thin film transistor is formed by the above-mentioned steps shown in FIGS. 2(A) to 2(H).

FIG. 3 shows a third embodiment of the present invention, in which the etching of the light-shielding thin film is applied to a semiconductor thin film of photosensor.

FIG. 3 shows a insulating light-transmitting substrate such as glass (31), a light-shielding thin film of semiconductor thin film (32), and a photoresist (33).

Each step of the process will be described in the order of FIGS. 3(A) to 3(H).

Figure 3A:
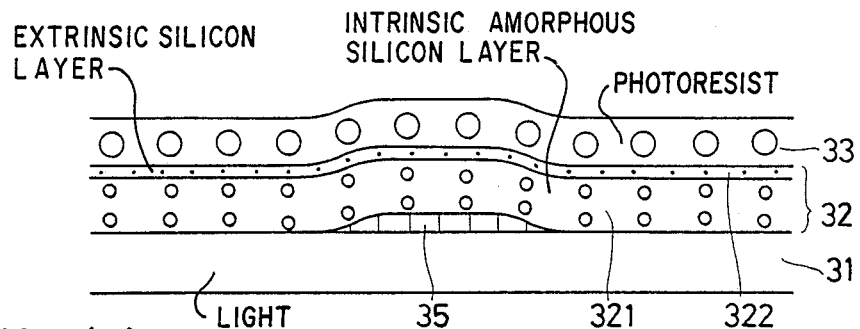

In FIG. 3(A) the substrate 31 has a previously formed lower electrode 35 (preferably formed by the process shown in the above-mentioned first embodiment). On this substrate 31 are formed an intrinsic amorphous silicon layer 321 (about 600 nm thick) and an extrinsic silicon layer 322 by plasma CVD method. (The former silicon layer contains substantially no impurities which function as donors or acceptors, and the latter silicon layer contains a proper amount of impurities which function as donors or acceptors.) The intrinsic amorphous silicon layer 321 and the extrinsic silicon layer 322 are semiconductor thin films which constitute the light-shielding thin film 32. Onto this light-shielding thin film 32 is applied a positive photoresist 33, followed by prebaking.

Figure 3B:
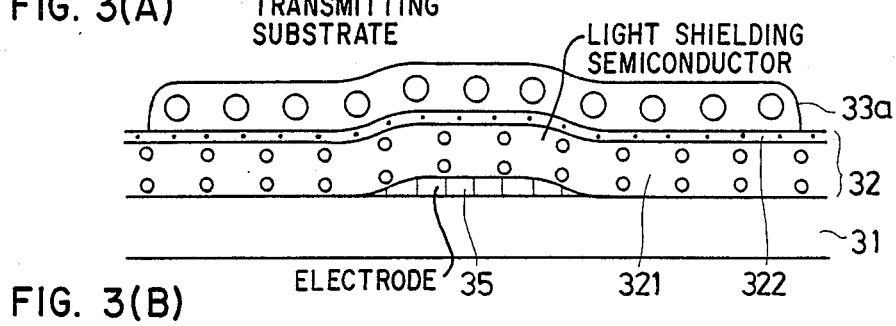

In FIG. 3(B) the prebaked photoresist 33 is exposed, followed by development, to form a photoresist pattern 33a of desired shape. Incidentally, no post-baking is performed.

Figure 3C:
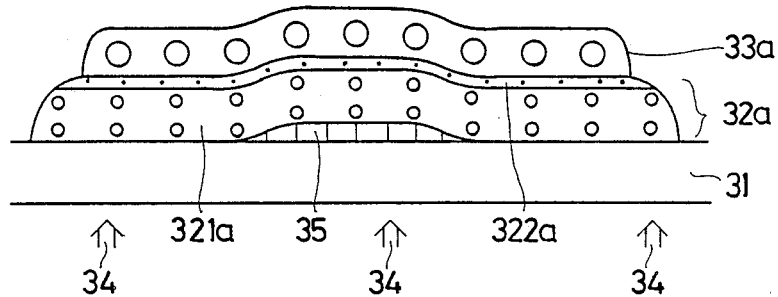

In FIG. 3(C) using the photoresist pattern 33a as a mask, the light-shielding thin film 32 is etched in the usual way to form the light-shielding thin film pattern 32a. (In the case where the light-shielding thin film is made of silicon as in this example, the light-shielding thin film 32 is etched while the photoresist pattern 33a is retreated by the resist retreating method, with plasma dry etching in which a mixed gas of fluorine-containing gas (e.g., CF₄) and oxygen is used as an etchant.) Then, the light-transmitting substrate 31 is irradiated through the reverse side with ultraviolet rays 34 (back exposure). Since the ultraviolet rays 34 are absorbed by the light-shielding thin film pattern 32a, the photoresist pattern 33a is hardly exposed. However, the edge of the photoresist pattern 33a is partly exposed by the diffracted or reflected (by backplate) ultraviolet rays 34.

Figure 3D:
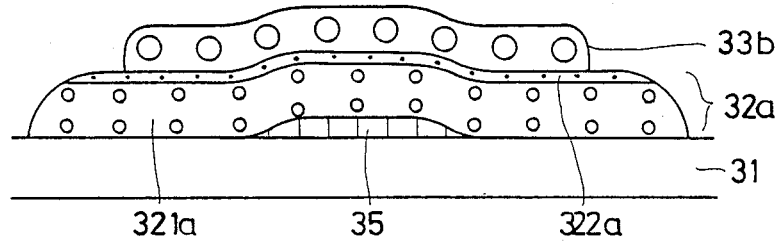

In FIG. 3(D) the photoresist pattern 33a is developed so that the edge of the photoresist pattern 33a which has been exposed in the step shown in FIG. 3(C) is removed. Thus the photoresist pattern 33b is smaller than the photoresist pattern 33a.

Figure 3E:
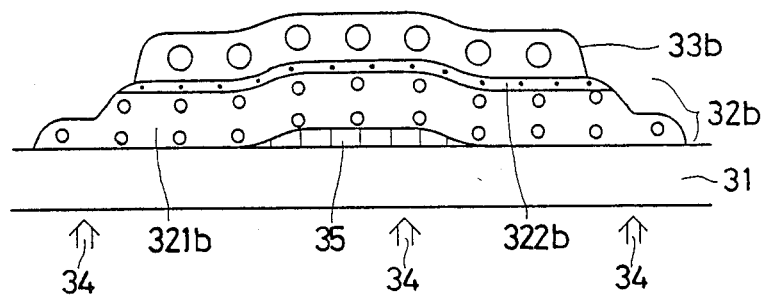

In FIG. 3(E) the light-shielding thin film pattern 32a is etched by plasma dry etching which uses a mixed gas of fluorine-containing gas such as CF₄ and oxygen as an etchant. During the plasma dry etching, the photoresist pattern 33b is retreated. (Incidentally, a mixed gas of fluorine-containing gas and oxygen is used in this example because a semiconductor thin film of silicon is used as the light-shielding thin film. This mixed gas may be replaced by another one according to the type of semiconductor thin film used.)

Then, the light-transmitting substrate 31 is irradiated through the reverse side with ultraviolet rays 34 (back exposure) for the exposure of the edge of the photoresist pattern 33b.

Figure 3F:
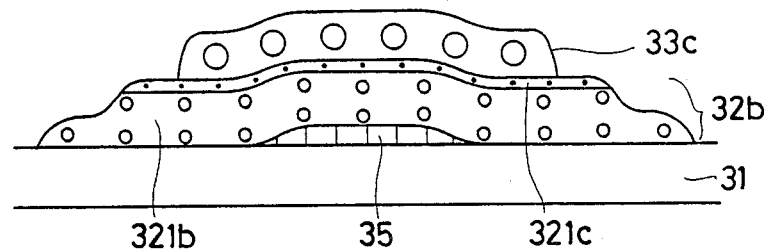

In FIG. 3(F) the photoresist pattern 33b is exposed, and the edge of the photoresist pattern 33b which has been exposed in the above-mentioned step shown in FIG. 3(E) is removed. Thus the photoresist pattern 33c is smaller than the photoresist pattern 33b.

Figure 3G:
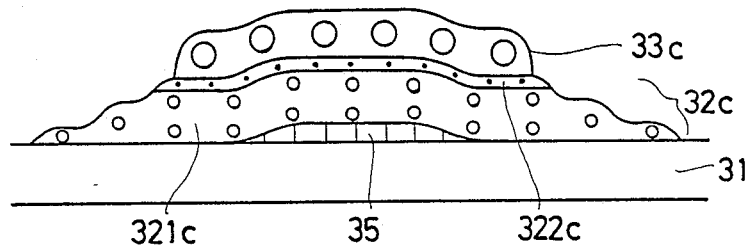

In FIG. 3(G) the light-shielding thin film pattern 32b is etched by plasma dry etching which uses a mixed gas of fluorine-containing gas such as CF₄ and oxygen as an etchant. During the plasma dry etching, the photoresist pattern 33c is retreated.

The light-shielding thin film pattern 32c formed by the above-mentioned steps has a stepwise thinned edge, as shown in FIG. 2(G), because the light-shielding thin film has undergone etching three times.

Figure 3H:
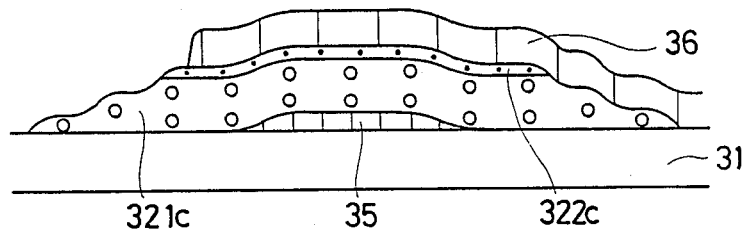

In FIG. 3(H) the photoresist pattern 33c is removed. Thus there is formed the light-shielding thin film pattern 32c of island structure. Then a conductive thin film 36 of ITO (indium tin oxide) is formed by EB evaporation or sputter evaporation. The conductive thin film is patterned according to a desired shape to form the upper electrode. Since the light-shielding thin film pattern 32c has a stepwise thinned edge, good step coverage of the conductive thin film is obtained without the possibility of breaking of the conductive thin film 36 at the steps.

Thus a photosensor is formed by the above-mentioned steps shown in FIGS. 3(A) to 3(H).

In the case of the first and second embodiments described above, the back exposure is performed once, and in the case of the third embodiment described above, the back exposure is performed twice. The back exposure may be repeated as many times as necessary according to the thickness of the light-shielding thin film etc.

In the second and third embodiments, the light-shielding thin film is a silicon layer; however, it may be replaced by other semiconductor such a CdTe.

According to the process of the present invention, it is possible to make the edge of the light-shielding thin film pattern thinner than other parts without increasing the number of masks. Therefore, the thin film formed on the light-shielding thin film completely covers the step of the light-shielding thin film, and there are very few possibilities of breaking of the covering thin film by the stepped edges. Thus the present invention provides an improved yield.

We claim:

1. A process for etching a light-shielding thin film which comprises the steps of:

applying a photoresist to a light-shielding thin film formed on a light-transmitting substrate;

exposing the photoresist and then developing the exposed photoresist, thereby forming a photoresist pattern of desired shape;

etching the light-shielding thin film by using the photoresist pattern as a mask, thereby forming a light-shielding thin film pattern matching the photoresist pattern;

exposing the photoresist pattern through the reverse side of the light-transmitting substrate by using the light-shielding thin film pattern as a mask and then developing the exposed photoresist pattern, thereby reducing the size of the photoresist pattern; and etching the light-shielding thin film pattern by using the reduced size photoresist pattern as a mask.

2. A process for etching a light-shielding thin film as claimed in claim 1 comprising using a metal thin film as the light-shielding thin film.

3. A process for etching a light-shielding thin film as claimed in claim 1 comprising using a semiconductor thin film as the light-shielding thin film.

4. A process for etching a light-shielding thin film as claimed in claim 3 comprising using a silicon thin film as the semiconductor thin film.

* * * * *